United States Patent
Le Bars et al.

(10) Patent No.: US 9,258,016 B2
(45) Date of Patent: Feb. 9, 2016

(54) METHOD AND APPARATUS FOR CONTROLLING THE DECODING OF CODEWORDS RECEIVED BY A LINEAR BLOCK CODE PIPELINED DECODER FROM AN INPUT BUFFER

(71) Applicant: CANON KABUSHIKI KAISHA, Tokyo (JP)

(72) Inventors: Phillippe Le Bars, Thorigne Fouillard (FR); Mounir Achir, Chantepie (FR)

(73) Assignee: Canon Kabushiki Kaisha, Tokyo (JP)

( * ) Notice: Subject to any disclaimer, the term of this patent is extended or adjusted under 35 U.S.C. 154(b) by 135 days.

(21) Appl. No.: 13/972,298

(22) Filed: Aug. 21, 2013

(65) Prior Publication Data

US 2014/0059402 A1 Feb. 27, 2014

(30) Foreign Application Priority Data

Aug. 23, 2012 (GB) .................................. 1215059.5

(51) Int. Cl.
*H03M 13/11* (2006.01)
*H03M 13/05* (2006.01)

(52) U.S. Cl.
CPC .......... *H03M 13/1145* (2013.01); *H03M 13/05* (2013.01); *H03M 13/1105* (2013.01); *H03M 13/1128* (2013.01); *H03M 13/1157* (2013.01)

(58) Field of Classification Search
CPC .................... H03M 13/1137; H03M 13/1105; H03M 13/1145
See application file for complete search history.

(56) References Cited

U.S. PATENT DOCUMENTS

| | | | |
|---|---|---|---|
| 5,577,196 A * | 11/1996 | Peer | 714/4.1 |
| 7,395,494 B2 * | 7/2008 | Lee et al. | 714/801 |
| 7,461,328 B2 * | 12/2008 | Dabiri et al. | 714/794 |
| 7,958,427 B1 | 6/2011 | Yeung et al. | |
| 8,102,951 B2 * | 1/2012 | Eun et al. | 375/340 |
| 8,136,008 B1 * | 3/2012 | Yeung | H03M 13/1102 714/755 |
| 8,234,536 B1 | 7/2012 | Farjadrad et al. | |
| 8,843,807 B1 * | 9/2014 | Stirling et al. | 714/774 |
| 2002/0067294 A1 * | 6/2002 | Shen et al. | 341/50 |

(Continued)

FOREIGN PATENT DOCUMENTS

KR 1020120039577 A 1/2012

OTHER PUBLICATIONS

Bhatt, T.; Sundaramurthy, V.; Stolpman, V.; McCain, D., "Pipelined Block-Serial Decoder Architecture for Structured Ldpc Codes," Acoustics, Speech and Signal Processing, 2006. ICASSP 2006 Proceedings. 2006 IEEE International Conference on , vol. 4, No., pp. IV,IV, May 14-19, 2006.*

(Continued)

*Primary Examiner* — Steve Nguyen
(74) *Attorney, Agent, or Firm* — Canon USA, Inc. IP Division (57) ABSTRACT

A computer implemented method of controlling the decoding of codewords received by a linear block code pipelined decoder from an input buffer, the pipelined decoder comprising at least two decoding stages. The method comprises iteratively: loading the decoding stages of the pipelined decoder, executing a decoding step, determining the number of residual errors in the codewords and outputting error free codewords. The method allows the different decoding stages to be loaded with any codeword coming from the buffer or from any decoding stage of the decoder. Accordingly, the occupation rate of the pipeline is improved.

16 Claims, 6 Drawing Sheets

(56) References Cited

U.S. PATENT DOCUMENTS

| | | | |
|---|---|---|---|
| 2004/0027909 A1* | 2/2004 | Muramatsu et al. | 365/232 |
| 2007/0089018 A1* | 4/2007 | Tang et al. | 714/752 |
| 2008/0263425 A1* | 10/2008 | Lakkis | 714/752 |
| 2010/0162071 A1* | 6/2010 | Andreev et al. | 714/752 |
| 2010/0192040 A1 | 7/2010 | Yedidia et al. | |
| 2010/0322048 A1* | 12/2010 | Yang et al. | 369/47.15 |

OTHER PUBLICATIONS

Marchand, C.; Dore, J.-B.; Conde-Canencia, L.; Boutillon, E., "Conflict resolution for pipelined layered LDPC decoders," Signal Processing Systems, 2009. SiPS 2009. IEEE Workshop on , vol., No., pp. 220,225, Oct. 7-9, 2009.*

* cited by examiner

# METHOD AND APPARATUS FOR CONTROLLING THE DECODING OF CODEWORDS RECEIVED BY A LINEAR BLOCK CODE PIPELINED DECODER FROM AN INPUT BUFFER

REFERENCE TO RELATED APPLICATIONS

This application claims the priority benefit under 35 U.S.C. §119(e) of GB Application No. 1215059.5, filed on Aug. 23, 2012. The text of this application is incorporated by reference in its entirety.

BACKGROUND OF THE INVENTION

The present invention concerns a method and a device of controlling the decoding received codewords in a linear block code as LDPC (Low Density Parity Check Code) decoder. The invention concerns codes that can be defined by a parity check matrix creating a direct relationship between the payload data and the redundancy necessary to protect this payload. LDPC codes and LDGM (Low Density Generator Matrix) codes are concerned, for example. Turbo codes issued from convolutional encodes are not concerned as the relationship that governs the redundancy depends on the state of the encoder and not directly on the data payload.

The process of decoding according to LDPC codes and the like is based on the decoding of a binary word, called a codeword, which length depends on the size of the matrix corresponding to the code. This codeword is the output of the demodulator and constitutes an estimate of the emitted word of information. This codeword is processed by a decoder to get a decoded word. The decoding is an iterative process. The number of iteration to achieve the proper decoding of the codeword depends on the number of errors, meaning inaccurate bit, in the estimated codeword. In presence of a good, without noise, transmission channel, we got a codeword exhibiting few or none errors, a single iteration of decoding could be enough to get the right decoded codeword. Some codeword comprising many errors could never be decoded whatever the number of iteration applied.

When decoding a stream of data over the transmission channel, in order to achieve real time decoding, it is important to get a decoding time for a codeword faster than the receiving time of this codeword. This is why pipelined architectures have been developed to implement series of decoding stage. A codeword enters the pipeline and could do any number of decoding stage to achieve the decoding of the word. This way, several codewords could be decoded in parallel. When a codeword decoding occurs in the middle of the pipeline, the last stages of pipeline could be unused.

Another technique is also used to improve the average decoding time. Given that the decoding time for a code word could vary depending on the number of errors to be corrected, buffering is used at the input of the decoder to spread over time the decoding of codewords. Assuming that codewords with a long decoding time and codewords with a fast decoding time are spread relatively evenly the use of an input buffer allows compensating the variations. Actual decoding shows that this is not always the case. It is also needed of course that the average decoding speed be faster than the receiving speed. When the buffer comes to overflow, either the last received word or the word being decoded is discarded.

SUMMARY OF THE INVENTION

The present invention has been devised to address one or more of the foregoing concerns.

According to a first aspect of the invention, there is provided a method for iterative decoding a codeword that improve the usage rate of the pipeline stage by allowing a new codeword to be injected in the pipeline at any stage which become available. Accordingly, the usage rate of the pipeline and therefore the average decoding speed is improved.

According to a second aspect of the invention, there is provided a method of iterative decoding using an input buffer where a buffer overflow trigger a search for the codeword in the decoder with the lower number of residual error to be outputted instead of discarding the new codeword or the one in the pipeline. Accordingly the number of residual errors in the decoded stream is reduced.

According to a third aspect of the invention, there is provided a method of iterative decoding where a maximal number of iteration is computed for each incoming codeword depending on the noise level of the transmission channel during the transmission of this word. Accordingly the decoding effort is spread over the different codewords relatively to the noise achieving a better distribution of this effort and therefore a lower average error rate.

According to a first aspect of the invention there is provided a computer implemented method of controlling the decoding of codewords received by a linear block code pipelined decoder from an input buffer, said pipelined decoder comprising at least two decoding stages, which comprises iteratively: loading the decoding stages of the pipelined decoder; executing a decoding step; determining the number of residual errors in the codewords and outputting error free codewords; and wherein loading the decoding stages allows the different decoding stages to be loaded with any codeword coming from the buffer or from any decoding stage of the decoder. Accordingly, the occupation rate of the pipeline is improved.

In an embodiment the method further comprises raising a slow decoding condition when the decoding speed becomes slower than the data reception and outputting the codeword in the pipelined decoder having the lower number of residual errors when the slow decoding condition is raised. Accordingly, the decoded symbols contains less errors.

In an embodiment the method further comprises determining for each inputted codewords a maximum of decoding step to be executed based on the transmission channel conditions at the moment of the actual transmission of the codeword and outputting the codeword from the pipelined decoder when this maximum of decoding step has been executed on this codeword. Accordingly, the time spend on the decoding of each codeword is coherent with the channel condition and well spread over codewords.

In an embodiment the method further comprises evaluating the SNR in the transmission channel at the moment of the actual transmission of the codeword to be used as the transmission channel conditions. Accordingly, a reliable way of measuring the transmission channel conditions is provided.

In an embodiment the method further comprises determining a function that gives a theoretical maximum number of decoding step needed for the decoding of a given codeword based on the SNR value measured at the moment of its actual transmission; and for each codeword entering the pipelined decoder: determining the theoretical maximum number of decoding step needed for the decoding of all the codewords stored in the input buffer by summing the result of said function applied to the SNR value measured for each of these codewords; determining a ratio of this theoretical maximum number of decoding step needed for the decoding of all the codewords stored in the input buffer and the average number of iteration contemplated on preceding decoded codewords multiplied by the number of codewords in the input buffer; determining the maximum number of decoding step associated to this codeword as the result of the function applied to the SNR value measured for this codeword if the given ratio is below 1 and determining the maximum number of decoding step associated to this codeword as the floor of the result of function applied to the SNR value measured for this codeword divided by said ratio if the given ratio is 1 of above.

In an embodiment said function is a step function determined by simulating the transmission channel. Accordingly, a simple function is provided.

In an embodiment the said function is based on the Erlang distribution law. Accordingly an accurate function is provided.

In an embodiment the method further comprises determining a minimum and a maximum on the SNR value; discarding a codeword associated to a SNR value below the minimum and outputting the codeword directly as the decoding result if the SNR value associated if above the maximum.

In an embodiment said minimum and maximum are determined using the Erlang law. Accordingly, accurate values of these minimum and maximum are provided.

In an embodiment said minimum and maximum are determined by simulating the transmission channel. Accordingly, simple values of these minimum and maximum are provided.

In an embodiment the method further comprises reordering outputted codewords. Accordingly, the symbols are outputted in the right order.

According to another aspect of the invention there is provided a controller device for controlling the decoding of codewords received by a linear block code pipelined decoder from an input buffer, said pipelined decoder comprising at least two decoding stages, the controller device comprising: a loader for loading the decoding stages of the pipelined decoder; means to control the execution of a decoding step; means to determine the number of residual errors in the codewords and means for outputting error free codewords wherein the loader allows the different decoding stages to be loaded with any codeword coming from the buffer or from any decoding stage of the decoder.

In an embodiment the controller device further comprises means for raising a slow decoding condition when the decoding speed becomes slower than the data reception and means for outputting the codeword in the pipelined decoder having the lower number of residual errors when the slow decoding condition is raised.

In an embodiment the controller device further comprises means for determining for each inputted codewords a maximum of decoding step to be executed based on the transmission channel conditions at the moment of the actual transmission of the codeword and means for outputting the codeword from the pipelined decoder when this maximum of decoding step has been executed on this codeword.

In an embodiment the controller device further comprises means for evaluating the SNR in the transmission channel at the moment of the actual transmission of the codeword to be used as the transmission channel conditions.

In an embodiment the controller device further comprises means for determining a function that gives a theoretical maximum number of decoding step needed for the decoding of a given codeword based on the SNR value measured at the moment of its actual transmission; and for each codeword entering the pipelined decoder: means for determining the theoretical maximum number of decoding step needed for the decoding of all the codewords stored in the input buffer by summing the result of said function applied to the SNR value measured for each of these codewords; means for determining a ratio of this theoretical maximum number of decoding step needed for the decoding of all the codewords stored in the input buffer and the average number of iteration contemplated on preceding decoded codewords multiplied by the number of codewords in the input buffer; means for determining the maximum number of decoding step associated to this codeword as the result of the function applied to the SNR value measured for this codeword if the given ratio is below 1 and means for determining the maximum number of decoding step associated to this codeword as the floor of the result of function applied to the SNR value measured for this codeword divided by said ratio if the given ratio is 1 of above.

In an embodiment said function is a step function determined by simulating the transmission channel.

In an embodiment said function is based on the Erlang distribution law.

In an embodiment the controller device further comprises means for determining a minimum and a maximum on the SNR value; means for discarding a codeword associated to a SNR value below the minimum and means for outputting the codeword directly as the decoding result if the SNR value associated if above the maximum.

In an embodiment said minimum and maximum are determined using the Erlang law.

In an embodiment said minimum and maximum are determined by simulating the transmission channel.

In an embodiment the controller device further comprises means for reordering outputted codewords.

According to another aspect of the invention there is provided a computer-readable storage medium storing instructions of a computer program for implementing a method, according to any one of claims 1 to 11.

At least parts of the methods according to the invention may be computer implemented. Accordingly, the present invention may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, the present invention may take the form of a computer program product embodied in any tangible medium of expression having computer usable program code embodied in the medium.

Since the present invention can be implemented in software, the present invention can be embodied as computer readable code for provision to a programmable apparatus on any suitable carrier medium. A tangible carrier medium may comprise a storage medium such as a floppy disk, a CD-ROM, a hard disk drive, a magnetic tape device or a solid state memory device and the like. A transient carrier medium may include a signal such as an electrical signal, an electronic signal, an optical signal, an acoustic signal, a magnetic signal or an electromagnetic signal, e.g. a microwave or RF signal.

BRIEF DESCRIPTION OF THE DRAWINGS

Embodiments of the invention will now be described, by way of example only, and with reference to the following drawings in which.

DETAILED DESCRIPTION OF THE PREFERRED EMBODIMENT

Figure 1:
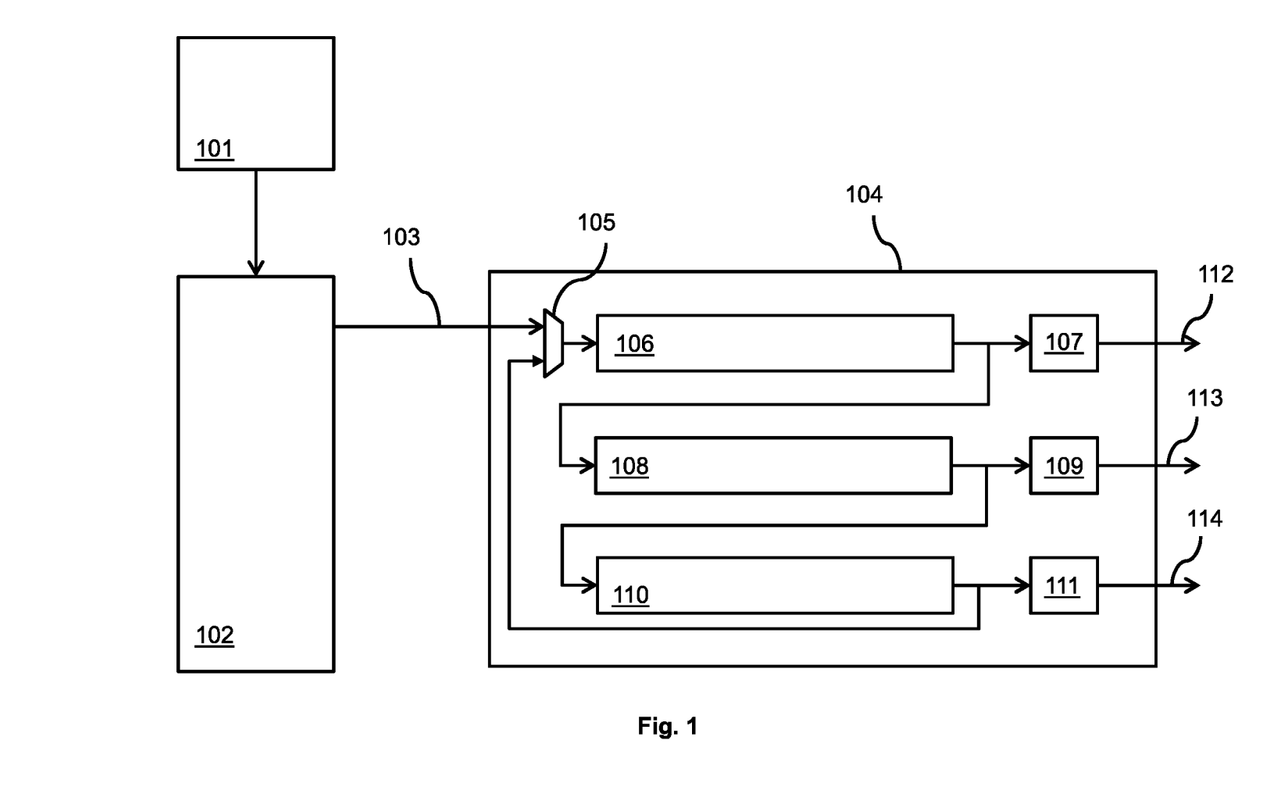
FIG. 1 illustrates the architecture of a decoder according to known prior art.

FIG. 1 illustrates the architecture of a LDPC decoder according to prior art. The signal is received by a demodulator 101. This is a classical circuit or a computer program that retrieves the baseband information from the modulated carrier wave. The binary baseband information is generally spatially coded into a space of two or more dimensions according to a constellation map. Each possible symbol is coded by a particular point in the constellation. Each symbol corresponds to a bit sequence. The symbol emitted is exactly a symbol of the constellation. The symbol received is the emitted symbol plus noise added by the transmission channel. There are several methods to get an estimate of the emitted symbol knowing the received one. It is possible to use the closest point of the constellation or the maximum likelihood theory. As the LDPC operates on codewords, the estimates are stored in the buffer 102 as successive codewords.

The decoding consists in determining the emitted symbol knowing the estimate codeword. Therefore the codewords are sent to the decoder 104 by the link 103, the buffer working in a FIFO (First In, First Out) mode.

The decoder 104 is basically a pipeline of decoding stages 106, 108 and 110. The actual architecture of a stage of pipeline in a LDPC decoder is not described in this document as it is well known by the person skilled in the art. A codeword is inputted in the first stage 106. At the end of the decoding stage, a decision module 107 has the task of deciding if the decoding process is terminated. In that case, the result, meaning a decoded codeword, is outputted referenced 112. In case the decision module 107 decides that the decoding process should continue, the codeword is sent to next decoding stage 108. The same operation occurs. The decision module 109 decides to output the result referenced 113 or to continue with decoding stage 110. The last decision module 111 decides to output the result or to send the codeword back to decoding stage 106 via the selector 105.

The figure has three pipeline stages. The person skilled in the art would understand that this is just an example and that any number of decoding stages may be implemented.

It can be noticed that when a codeword is outputted from the first of second stage 106 or 108, at next step, the following stage 108 or 110 will be unused. Some conflicts occur at the input of stage 106 when a codeword coming from stage 110 should be inputted again in the pipeline while a new codeword is ready for decoding from the buffer 102. When this happens, the new codeword should be blocked until the freeing of the first stage 106.

The exemplary embodiment of the invention aims to improve the usage rate of the pipeline. It will be described in relation to FIG. 2.

Figure 2:
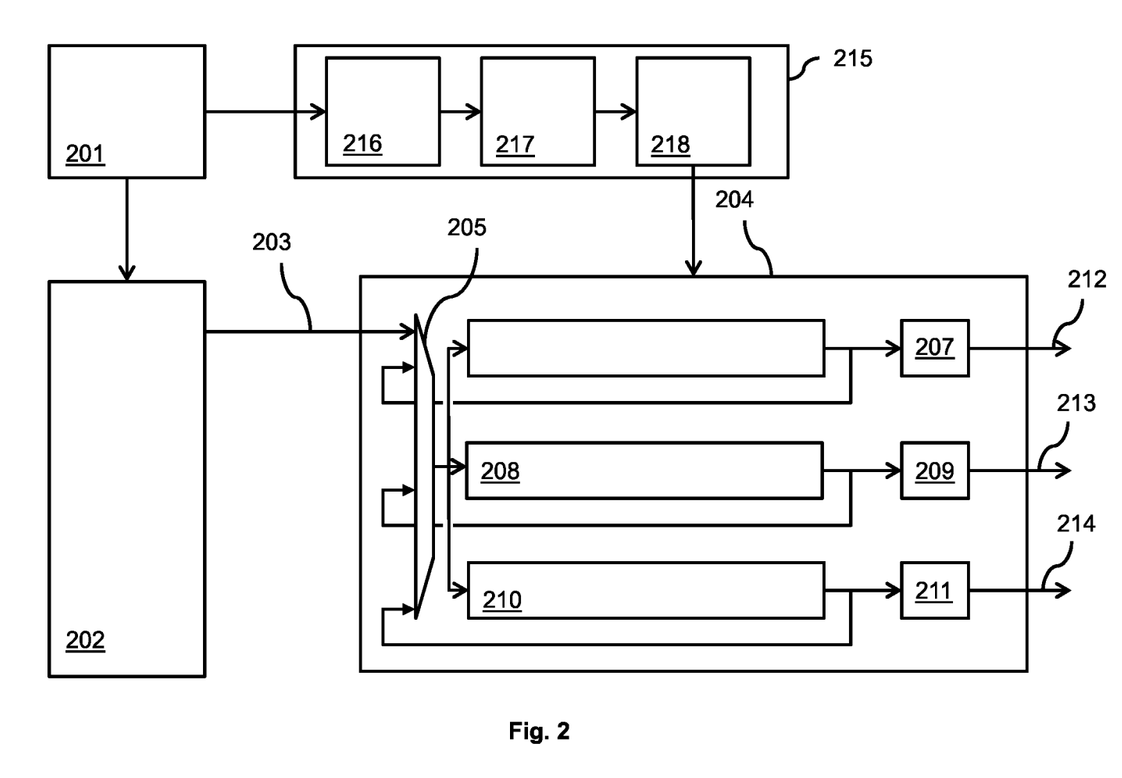
FIG. 2 illustrates the architecture of a decoder according to the exemplary embodiment of the invention.

The architecture of the decoder illustrate in FIG. 2 is similar to the architecture of FIG. 1, and comprises a demodulator 201, a buffer 102, decision modules 207, 209, an d211 which output results respectively referenced 212, 213, and 214. This architecture adds an iteration control module 215 to the preceding ones. The decoder itself differs in that the selector 205 is able to direct its input to any of the pipeline stage 206, 208 and 210. All the outputs of the decoding stage 206, 208 and 210 are directed to this selector 205.

According to this architecture, any codeword outputted from any decoding stage plus a new codeword from the buffer could be inputted in any free decoding stage of the decoder. The selection is done under the control of the iteration control module 215 and more particularly, under the control of the executive module 218. Modules 216 and 217 are used in other embodiments.

Accordingly, the conflicts at the input of the decoder are minimized and the usage rate of the different decoding stages of the decoder pipeline is improved.

While improving the usage rate of the pipeline and therefore the decoding speed, some buffer overflow could still happen. Particularly when the transmission channel becomes noisy, a high proportion of successive codewords could need lots of decoding stages.

According to a particular embodiment of the invention, when a buffer overflow occurs a decision to prematurely output a codeword from the decoder. In the prior art, the new codeword or the codeword being decoded was discarded meaning a complete loss of a codeword. According to this embodiment, the codeword is outputted and not loss. As the output is done prematurely some residual errors could remain in the codeword.

The detection of the buffer overflow is advantageously predicted in advance. For example, the reception data rate is monitored and compared with the decoding rate. When the decoding rate becomes lower than the reception data rate a condition of slow decoding is raised. This could be achieved, for example, by comparing the throughput at the input of the buffer and the throughput at the output of the decoder.

In order to reduce the number of residual errors in the decoded stream, in a particular embodiment, when the decision to prematurely output a codeword is taken, the codeword in the decoder containing the minimum number of residual errors is chosen.

Figure 3:
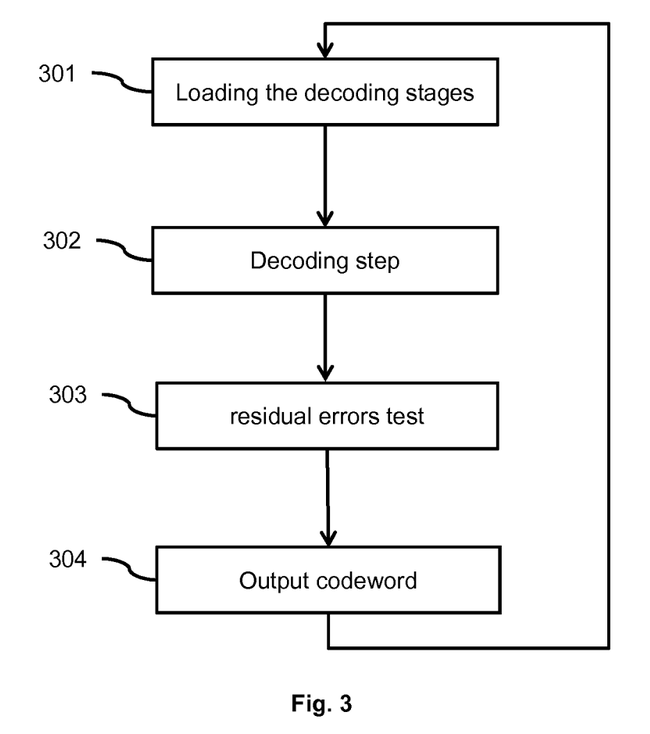
FIG. 3 illustrates the decoding of a codeword using a pipelined decoder according to the exemplary embodiment of the invention.

FIG. 3 illustrates the decoding method using the pipelined decoder as illustrated on FIG. 2.

This pipeline works iteratively. In a first step 301 a loading step is executed. In this step the decoding stages constituting the pipeline are loaded. Typically each stage is loaded with the data coming from the preceding stage. The first stage may be loaded by a codeword entering the decoder from the buffer or by a codeword coming from the last stage if further decoding is needed for this codeword.

Then a decoding step 302 is undertaken. Following the decoding, a test step 303 is conducted to evaluate the number of residual errors remaining in the codewords. Codewords which do not contain any more error may be outputted in step 304. The method is then resumed to the input step 301.

Taking advantage of the invention, the input step 301 allows the different decoding stages to be loaded with any codeword coming from the buffer or from any decoding stage of the decoder. Therefore, any free decoding stage may be loaded by a new codeword leading to an improved occupation rate of the pipeline.

Figure 4:
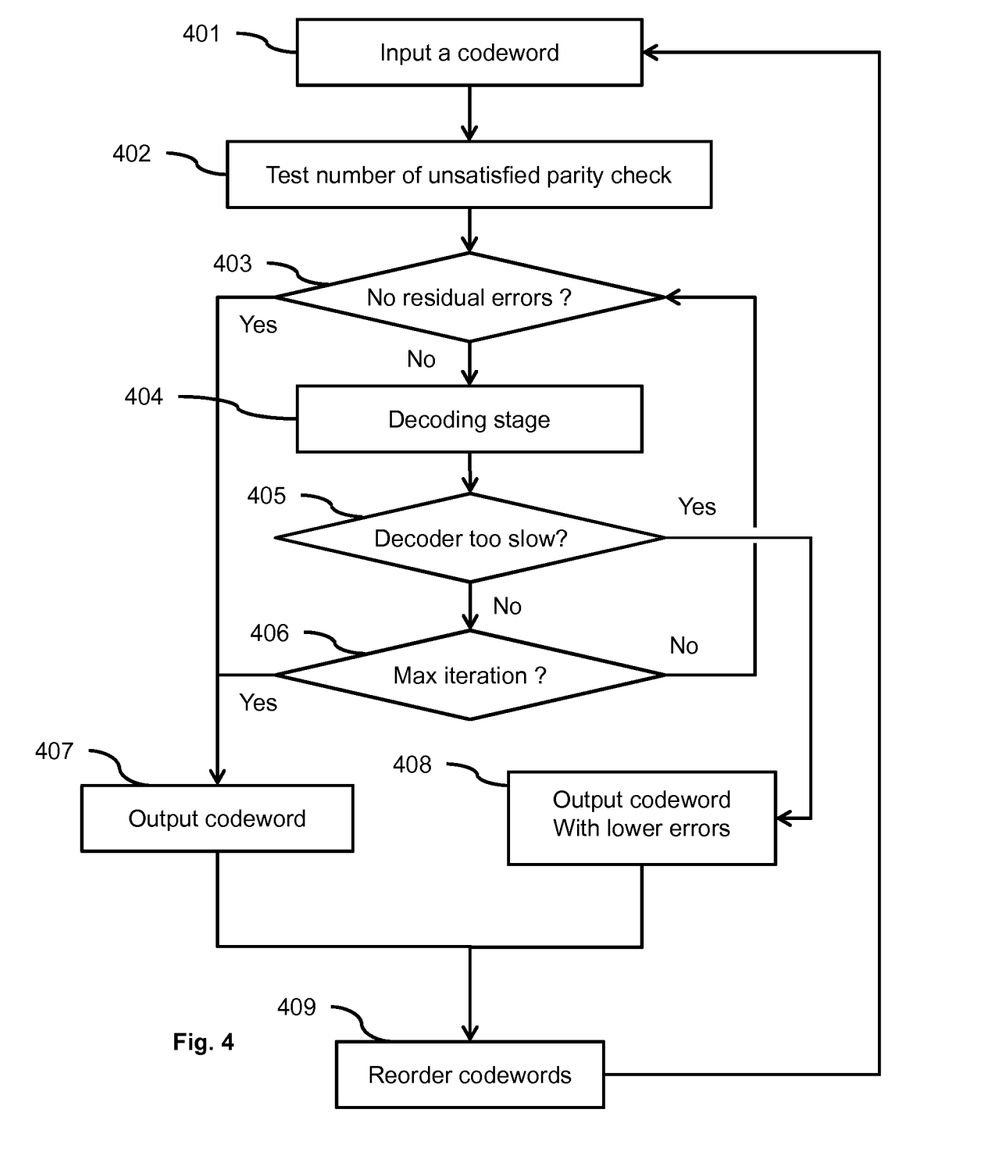
FIG. 4 illustrates the decoding of a codeword according to an alternative embodiment of the invention.

This embodiment is illustrated by FIG. 4. In a first step 401, a codeword is inputted in the decoder from the buffer. According to the LDPC principles, the parity check matrix is applied to the codeword in step 402. As a result a number of residual errors in the codeword is determined and associated to the codeword. This number of residual errors is tested in step 403. If the codeword is error free, the code word could be outputted in a step 407.

In case there are still residual errors in the codeword a decoding stage is run in a step 404. Next the decoder too slow condition is tested in step 405. As described above, the condition is raised when the decoding speed becomes slower than the data reception rate. This condition if it stays for a while will leads to a buffer overflow. Therefore, a measure to speed up the decoding is taken. It consists in the prematurely output of a codeword from the decoder when the slow decoding condition is raised in a step 408. Advantageously, as several codewords are in the decoding process thanks to the pipelined architecture, it is possible to select the one containing the lower number of residual errors.

In case the decoder is not too slow, the number of iterations is tested against a predetermined maximum number of iterations. Actually, as some codewords contain too many errors to be corrected by any number of iteration it is necessary to limit the number of iteration to a maximum to prevent these codewords to stay forever in the decoder. If this maximum number of iteration is reached for the current codeword under decoding, it is outputted in the step 407 whatever the number of residual errors it contains. If not, the number of residual errors is tested again in the step 403.

As the moment of output of a codeword is not predictable depending on the number of residual errors it contains and on the slow decoding condition, a codeword entered in the decoder after another one could be outputted before. The sequence of the codewords is modified by the decoder and should be restored, which is done by the reordering step 409. Advantageously, the codewords are associated to sequence numbers attributed at the input of the decoder to allow this reordering step. Next a new codeword is inputted in the decoder.

Alternatively, the condition of buffer overflow is prevented by the mechanism based on the determination of a maximum of iteration per codeword. This maximum is determined based on the transmission channel conditions at the moment of the actual transmission of this codeword. These transmission channel conditions may be estimated by the SNR (Signal to Noise Ratio). In this mechanism the SNR of the transmission channel is measured. One measure is associated to each received codeword. As the number of iteration in the pipelined decoder is correlated to the number and the place of the errors in the received codeword and because this number of errors is itself correlated to the channel condition, it is assumed that the number of iteration needed to decode a codeword is correlated to the level of SNR on the transmission channel when this codeword has been transmitted. More particularly, it is assumed that a function, that will be called $f$ in the following, may be defined to determine a maximum of iterations needed to decode a given codeword from the level of the SNR for that particular codeword.

Noise evaluation may be made using the distance between the received point and theoretical location of the closest symbol. For example, the average of those values may be taken for the block of data corresponding to one LDPC codeword. Any other method to get an estimate of the noise may be used alternatively. As an example, the U.S. Pat. No. 6,898,251 B2 describes a method to do this evaluation in the context of a turbo decoder. That method could be adapted easily for a LDPC decoder.

The inventors have determined several such function $f$. In a first embodiment, the function $f$ is defined as a step function attributing a particular value for the maximum of iterations for an interval of SNR values. The intervals and the value of the maximum of iterations for each interval may be determined by simulation of the transmission channel and decoding of codewords using the same code.

Advantageously, this function $f$ is given by the Erlang law. The number of errors that a word suffers is dependent on the noise affecting the signal, which is generally considered as a Gaussian process. The number of iterations that is needed to correct all errors is dependent on the number of errors and their positions, as nodes in the graph are not equally connected, as well as the amount of noise the node has received. Hence the parallel can be made to the telephony system. A call can happen at any moment and its duration is not known. An error can have happened everywhere in the frame, and the number of iteration to correct this frame is difficult to predict. Then not surprisingly, the number of iterations has the Erlang distribution function, similarly to the branch exchange occupation in telephony.

We recall that the Erlang distribution is defined by 2 parameters, a real $\lambda$ and an integer k.

$$y = \frac{\lambda^k x^{k-1} e^{-\lambda x}}{(k-1)!};$$

where x>0 and y expectation is $k/\lambda$.

As a non-limitative example the intensity parameter $\lambda$ is 3 for the matrix defined in the 80.3.15c standards. k and $\lambda$ depends on the SNR. $k/\lambda$ is the expectation of the distribution corresponding to the average number of iteration that are necessary at a certain SNR.

For the telephony analogy, k is the number of incoming calls. $1/\lambda$ is their average duration. A good way to set the k and $\lambda$ parameters is to run some simulations and fit the parameters to the results. The quality of the matrix is important. A matrix that does not achieve any code distance will generate trapping sets which will obviously create large number of uncorrected word. If the matrix is well conditioned and achieve some code distance it is then easy to define a maximum number of iteration Itmax and to execute this number of iteration. For example we may want 99% of decoded word at 1 dB of SNR, which leads to 7 iterations with the well-conditioned matrix of the example. The codeword is obtained or not at the end, but the latency is now defined and so SNR_max will be 7 dB. SNR_min will be 1 dB, leading to the realization of a maximum of iterations of 7.

Figure 5:
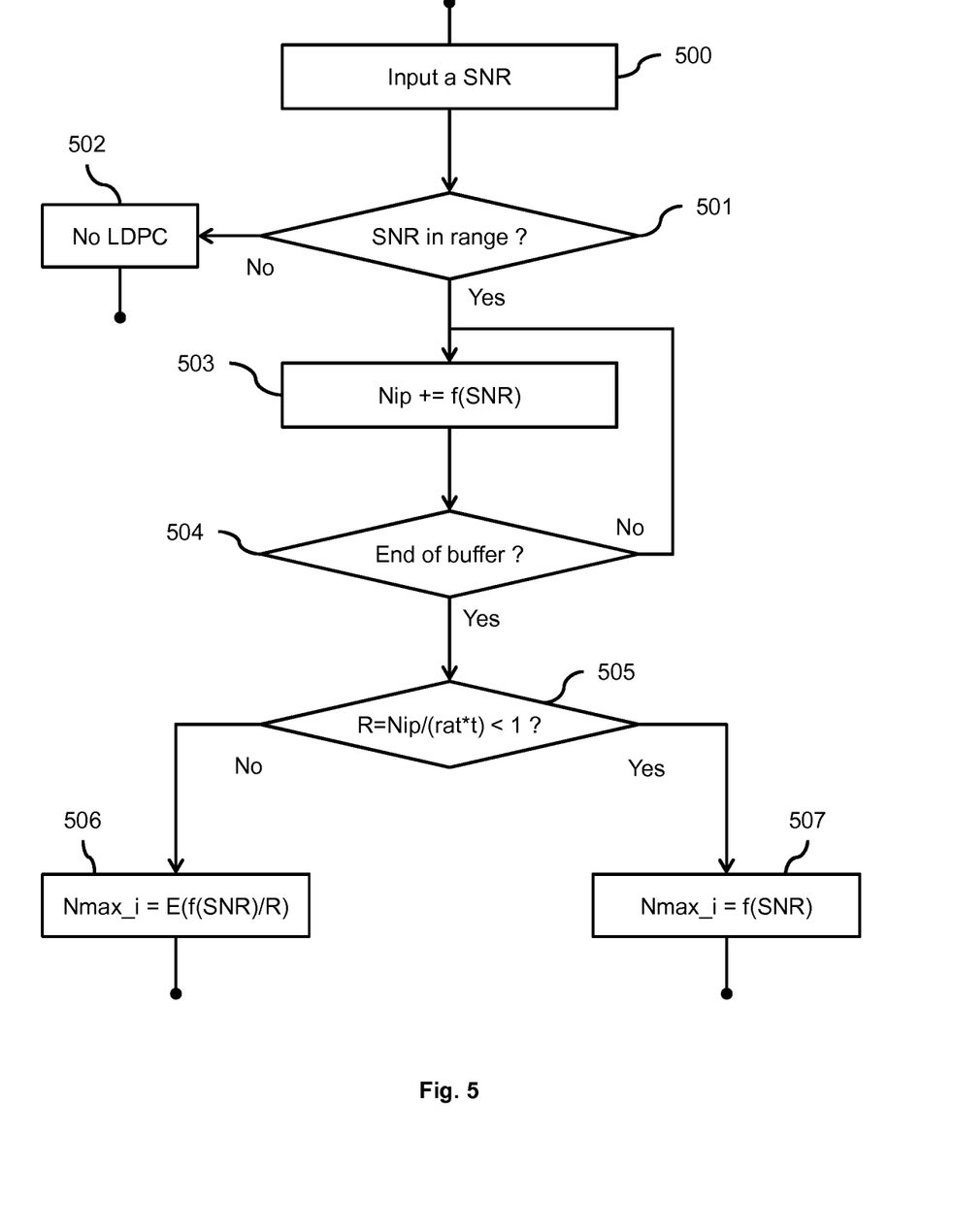
FIG. 5 illustrates the determination process of the maximum iteration per codeword as used in an embodiment of the invention.

FIG. 5 illustrates the determination process of this maximum iteration per codeword as used in the exemplary embodiment of the invention. This process is implemented in the iteration control module 215 on FIG. 2. It takes advantage of SNR evaluation module referenced 216 on FIG. 2. This module measures the SNR in the transmission channel at the moment of the transmission of each codeword. These measures are stored, for example, in a buffer referenced 217 on FIG. 2.

The process is initiated when for a given codeword of index i enters in the decoding system from the buffer. At step 500 the corresponding SNR measure is also input in the decoder. A first test is advantageously undertaken in a step 501 to determine if the measured SNR is compatible with the decoding. If the SNR is over a given maximum, it is almost sure that the codeword does not contain any error. Therefore a LDPC decoding is not undertaken, the codeword is output directly as the decoding result without any LDPC decoding step. If the SNR is lower than a given minimum, it is assumed that the decoding is not possible and the codeword is discarded. Therefore is the SNR value is not in a given range, no LDPC decoding is undertaken as illustrated by step 502. The minimum and the maximum thresholds may be determined using the Erlang law or by simulation.

If the SNR value is in the range, we determine the theoretical number of iteration needed to decode all the codewords in the buffer. This process is done by accumulating in a variable Nip the result of the function $f$ to the SNR of each codeword in the buffer. This is illustrated by steps 503 and 504. It is to be noted that a new evaluation of the number of iteration is undertaken for the whole buffer for each codeword entering the decoder.

In step 505, the ratio R=Nip/(rat*t) is determined where rat represents expected by design ratio of the speed of incoming word to be decoded to the speed of decoding them, based on an average number of iterations. t is the number of codewords in the buffer. This ratio is then compared to 1. A ratio R below 1 means that the decoder is fast enough. A ratio R above 1 means that the decoder is too slow.

Accordingly, the maximum number of iteration associated with the codeword of index i is determined as the direct result of function $f$ in the case of the decoder is fast enough in the step 507. In contrast, it is determined to a reduced value $$E\left(\frac{f(SNR)}{R}\right)$$

in the case of the decoder is too slow in the step 506. Where E(x) is the floor function.

Figure 6:
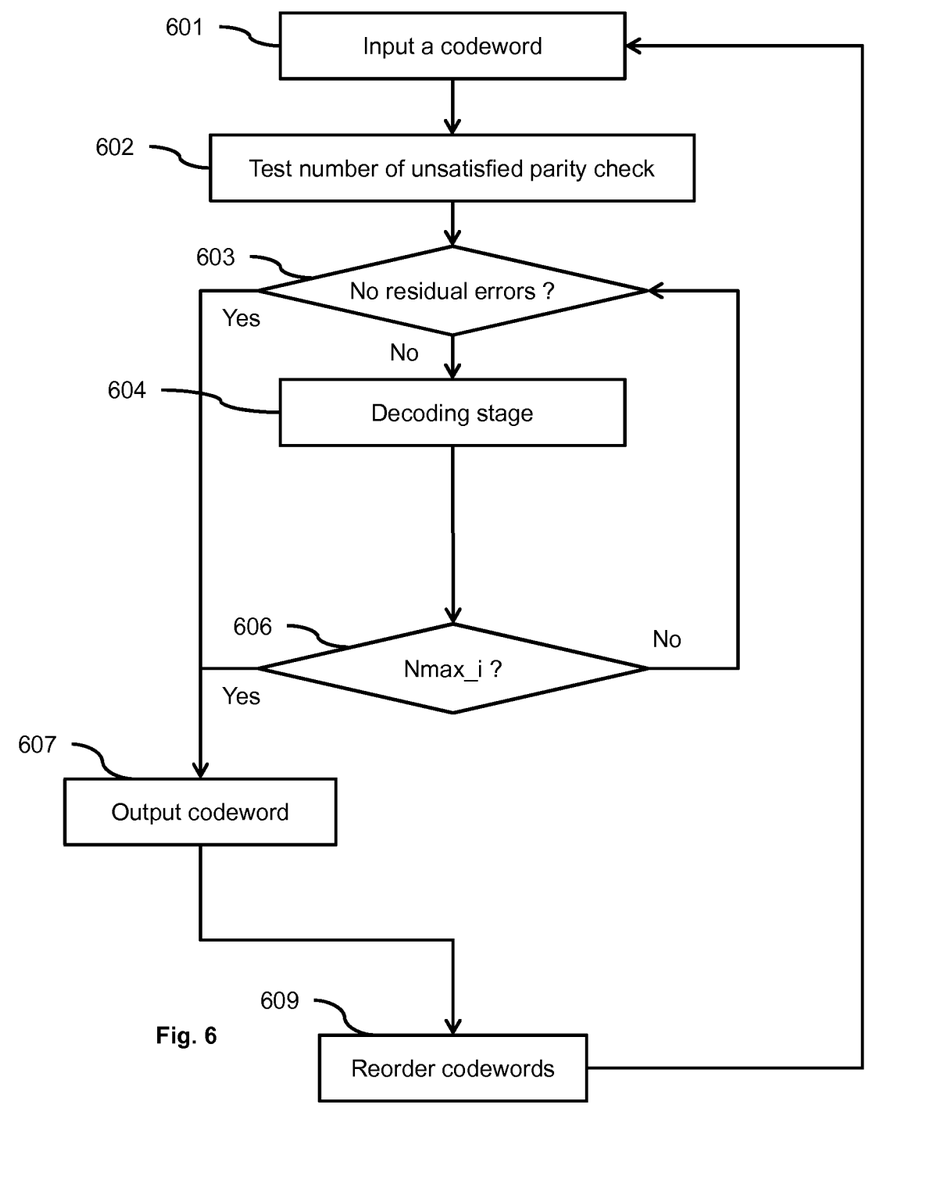
FIG. 6 illustrates the decoding process in an alternative embodiment including this determination of the maximum of iteration per codeword.

FIG. 6 illustrates the decoding process in an alternative embodiment including this determination of the maximum of iteration per codeword. This method is very similar to the on described on FIG. 4 and only the differing steps will be described. Assuming that the process illustrated on FIG. 5 is conducted for every codeword entering in the decoder from the buffer, a maximum number of iteration is known for each codeword. The steps 405 and 408 of FIG. 4 have been suppressed. As the actual speed of the decoder is taken into account in the determination of the maximum number of iteration per codeword, a specific step to determine if the decoder is too slow is not needed anymore.

The step 406 in FIG. 4 where the current number of iteration was tested against a global maximum number of iteration becomes the step 606 where the current number of iteration is now tested against the specific maximum number of iteration determined for this particular codeword. While this maximum is not reached and there are still errors in the decoded codeword some decoding stage 604 are undertaken. In the case of there is no more errors or this maximum of iteration is reached, the codeword is output in step 607.

Accordingly a maximum number of iteration is determined per codeword being as close as possible to the theoretical needed number of iteration for decoding. When this maximum should be decreased due to a decoding speed too low, this is done taking into account the actual need of each codeword. Therefore the obtained error rate is very good. The adaptation of the decoding to the actual decoding speed and the prevention of buffer overflow is integrated in the determination of the maximum number of iteration per codeword and its management like in the decoding method of FIG. 5 is not needed.

Any step of the algorithm shown in FIG. 3, 4, 5, or 6 may be implemented in software by execution of a set of instructions or program by a programmable computing machine, such as a PC ("Personal Computer"), a DSP ("Digital Signal Processor") or a microcontroller; or else implemented in hardware by a machine or a dedicated component, such as an FPGA ("Field-Programmable Gate Array") or an ASIC ("Application-Specific Integrated Circuit").

Although the present invention has been described hereinabove with reference to specific embodiments, the present invention is not limited to the specific embodiments, and modifications will be apparent to a skilled person in the art which lie within the scope of the present invention.

Many further modifications and variations will suggest themselves to those versed in the art upon making reference to the foregoing illustrative embodiments, which are given by way of example only and which are not intended to limit the scope of the invention, that being determined solely by the appended claims. In particular the different features from different embodiments may be interchanged, where appropriate.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used.

The invention claimed is:

1. A computer implemented method of controlling the decoding of codewords received by a linear block code pipelined decoder from an input buffer, said pipelined decoder comprising at least two decoding stages, the method comprising iteratively:
    loading the decoding stages of the pipelined decoder;
    executing a decoding step; determining the number of residual errors in the codewords; and
    outputting error free codewords;
    wherein:
    loading the decoding stages allows the different decoding stages to be loaded with any codeword coming from the buffer or from any decoding stage of the decoder;
    the method further comprising:
    evaluating for each input codewords the SNR in the transmission channel at the moment of the actual transmission of the codeword;
    determining a function that gives a theoretical maximum number of decoding step needed for the decoding of a given codeword based on the SNR value measured at the moment of its actual transmission; and
    for each codeword entering the pipeline decoder:
    determining the theoretical maximum number of decoding step needed for the decoding of all the codewords stored in the input buffer by summing the result of said function applied to the SNR value measured for each of these codewords;
    determining a ratio of the theoretical maximum number of decoding step needed for the decoding of all the codewords stored in the input buffer and the average number of iteration contemplated on preceding decoded codewords multiplied by the number of codewords in the input buffer;
    determining the maximum number of decoding step associated with the codeword as the result of the function applied to the SNR value measured for the codeword if the given ratio is below 1;
    determining the maximum number of decoding step associated to the codeword as the floor of the result of the function applied to the SNR value measured for the codeword divided by said ratio if the given ratio is 1 or above; and
    outputting the codeword from the pipelined decoder when the maximum of decoding step has been executed on the codeword.

2. The method according to claim 1 wherein said function is a step function determined by simulating the transmission channel.

3. The method according to claim 1 wherein said function is based on the Erlang distribution law.

4. The method according to claim 1 further comprising:
determining a minimum and a maximum on the SNR value;
discarding a codeword associated to a SNR value below the minimum; and
outputting the codeword directly as the decoding result if the SNR value associated is above the maximum.

5. The method according to claim 4 wherein said minimum and maximum are determined using the Erlang distribution law.

6. The method according to claim 4 wherein said minimum and maximum are determined by simulating the transmission channel.

7. The method according to claim 1 further comprising reordering outputted codewords.

8. A controller device for controlling the decoding of codewords received by a linear block code pipelined decoder from an input buffer, said pipelined decoder comprising at least two decoding stages, the controller device comprising:
a loader for loading the decoding stages of the pipelined decoder;
an electronic circuit configured to control the execution of a decoding step;
means to determine the number of residual errors in the codewords; and
an electronic circuit configured to output error free codewords;
wherein:
the loader allows the different decoding stages to be loaded with any codeword coming from the buffer or from any decoding stage of the decoder;
the controller device further comprising:
an electronic circuit configured to evaluate for each input codewords the SNR in the transmission channel at the moment of the actual transmission of the codeword to be used as the transmission channel conditions;
an electronic circuit configured to determine a function that gives a theoretical maximum number of decoding step needed for the decoding of a given codeword based on the SNR value measured at the moment of its actual transmission; and
for each codeword entering the pipelined decoder:
an electronic circuit configured to determine the theoretical maximum number of decoding step needed for the decoding of all the codewords stored in the input buffer by summing the result of said function applied to the SNR value measured for each of these codewords;
an electronic circuit configured to determine a ratio of the theoretical maximum number of decoding step needed for the decoding of all the codewords stored in the input buffer and the average number of iteration contemplated on preceding decoded codewords multiplied by the number codewords in the input buffer;
an electronic circuit configured to determine the maximum number of decoding step associated to this codeword as the result of the function applied to the SNR value measured for this codeword if the given ratio is below 1;
an electronic circuit configured to determine the maximum number of the decoding step associated to this codeword as the floor of the result of function applied to the SNR value measured for this codeword divided by said ratio if the given ratio is 1 or above; and an electronic circuit configured to output the codeword from the pipelined decoder when the maximum of decoding step has been executed on this codeword.

9. The controller device according to claim 8 further comprising:
an electronic circuit configured to raise a slow decoding condition when the decoding rate becomes slower than the data reception rate; and
an electronic circuit configured to output the codeword in the pipelined decoder having the lower number of residual errors when the slow decoding condition is raised.

10. The controller device according to claim 8 wherein said function is a step function determined by simulating the transmission channel.

11. The controller device according to claim 8 wherein said function is based on the Erlang distribution law.

12. The controller device according to claim 8 further comprising:
an electronic circuit configured to determine a minimum and a maximum on the SNR value;
an electronic circuit configured to discard a codeword associated to a SNR value below the minimum; and
an electronic circuit configured to output the codeword directly as the decoding result if the SNR value associated is above the maximum.

13. The controller device according to claim 12 wherein said minimum and maximum are determined using the Erlang distribution law.

14. The controller device according to claim 12 wherein said minimum and maximum are determined by simulating the transmission channel.

15. The controller device according to claim 8 further comprising an electronic circuit configured to reorder outputted codewords.

16. A non-transitory computer-readable storage medium on which is stored codes of an executable program causing a computer to implement a method of controlling the decoding of codewords received by a linear block code pipelined decoder from an input buffer, said pipelined decoder comprising at least two decoding stages, the method comprising iteratively:
loading the decoding stages of the pipelined decoder;
executing a decoding step;
determining the number of residual errors in the codewords; and
outputting error free codewords;
wherein:
loading the decoding stages allows the different decoding stages to be loaded with any codeword coming from the buffer or from any decoding stage of the decoder;
the method further comprising:
evaluating for each input codeword the SNR in the transmission channel at the moment of the actual transmission of the codeword;
determining a function that gives a theoretical maximum number of decoding step needed for the decoding of a given codeword based on the SNR value measured at the moment of its actual transmission; and
for each codeword entering the pipelined decoder;
determining the theoretical maximum number of decoding step needed for the decoding of all the codewords stored in the input buffer by summing the result of said function applied to the SNR value measured for each of these codewords;
determining a ratio of the theoretical maximum number of decoding step needed for the decoding of all the codewords stored in the input buffer and the average number of iteration contemplated on preceding decoded codewords multiplied by the number of codewords in the input buffer;

determining the maximum number of decoding step associated to this codeword as the result of the function applied to the SNR value measured for this codeword if the given is below 1; and determining the maximum number of decoding step associated to this codeword as the floor of the result of the function applied to the SNR value measured for this codeword divided by said ratio if the given ratio is 1 or above; and outputting the codeword from the pipelined decoder when this maximum of decoding step has been executed on this codeword.

* * * * *